United States Patent [19]
Belouet

[11] Patent Number: 4,520,752
[45] Date of Patent: Jun. 4, 1985

[54] DEVICE FOR DEPOSITING A LAYER OF POLYCRYSTALLINE SILICON ON A CARBON TAPE

[75] Inventor: Christian Belouet, Sceaux, France

[73] Assignees: Compagnie General d'Electricite; Societe Nationale Elf Aquitaine, both of Paris, France

[21] Appl. No.: 643,927

[22] Filed: Aug. 24, 1984

[30] Foreign Application Priority Data

Aug. 30, 1983 [FR] France .................. 83 13915

[51] Int. Cl.³ .......................................... B05C 3/172
[52] U.S. Cl. ..................................... 118/405; 118/401; 118/419
[58] Field of Search ............... 118/405, 419, 429, 102, 118/401, 404; 427/86; 156/624

[56] References Cited

U.S. PATENT DOCUMENTS

| | | |
|---|---|---|
| 1,503,128 | 7/1924 | Leland et al. ............ 118/419 X |
| 2,577,904 | 12/1951 | McNabb et al. . |
| 3,429,734 | 2/1969 | Coad . |
| 4,299,648 | 11/1981 | Ciszek et al. ............ 156/608 |

Primary Examiner—John P. McIntosh
Attorney, Agent, or Firm—Sughrue, Mion, Zinn, Macpeak, and Seas

[57] ABSTRACT

A device for depositing a layer of polycrystalline silicon on a carbon tape comprises a bath of molten silicon through which the carbon tape is drawn vertically. Two semicircular channels are supported vertically in the vicinity of the edges of the tape with their concave side towards the tape. The channels are partially immersed in the bath so as to raise the level of its surface by capillary action. The device is applicable to the manufacture of solar cells.

1 Claim, 7 Drawing Figures

DEVICE FOR DEPOSITING A LAYER OF POLYCRYSTALLINE SILICON ON A CARBON TAPE

BACKGROUND OF THE INVENTION

1. Field of the Invention

The present invention concerns a device for depositing a layer of polycrystalline silicon on a carbon tape, of the type comprising a crucible containing a bath of molten silicon, a carbon tape at least partially immersed in the bath and passing lengthwise and vertically through the equilibrium surface of the bath, and means for progressively moving the tape vertically upwards, so as to deposit said layer on the sides of the tape.

2. Description of the Prior Art

In a known device of this type, described in French Pat. No. 2,386,359, The bottom of the crucible comprises a narrow opening through which the tape enters the bath and moves through it vertically upwards.

This device has a disadvantage. It is found that the thickness of the layer of silicon deposited on the sides of the tape rapidly decreases towards the two lateral edges of the tape. It results from this that the deposited layer of silicon features along these two lateral edges respective lateral strips in which the physical characteristics are degraded relative to those of the median part of the layer. These lateral strips are virtually unusable, in particular for the manufacture of solar cells.

The objective of the present invention is to overcome this disadvantage.

SUMMARY OF THE INVENTION

The invention consists in a device for depositing a layer of polycrystalline silicon on a carbon tape, comprising:

a crucible adapted to contain a bath of molten silicon, means for moving vertically upwards a carbon tape at least partially immersed in said bath and passing lengthwise and vertically through an equilibrium surface of said bath, whereby said layer is deposited on said tape, two vertical channels of semicircular cross-section adapted to be partially immersed in said bath with each one surrounding a respective lateral edge of said tape, whereby the surface of said bath is raised by capillary action in the vicinity of said lateral edges of said tape, and supports to which said channels are attached and which are supported by a wall of said crucible.

Other objects and advantages will appear from the following description of an example of the invention, when considered in connection with the accompanying drawings, and the novel features will be particularly pointed out in the appended claims.

DESCRIPTION OF THE PREFERRED EMBODIMENT

Figure 1:
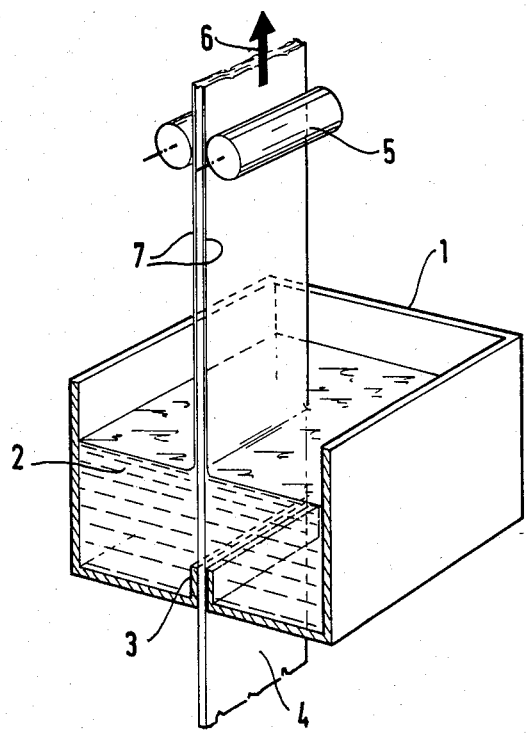
FIG. 1 is a view in perspective of a device known from French Pat. No. 2,386,359 in partial cross-section on a vertical plane.

FIG. 1 shows a parallelepipedal crucible 1 of silica containing a bath 2 of molten silicon. The bottom of the crucible 1 comprises a narrow slit 3 through which passes vertically a carbon tape 4 which exits the bath 2 on passing through its horizontal equilibrium surface. The width of the slit is determined so that the meniscus in the liquid silicon in the slit remains stable. The device further comprises heating means (not shown) disposed around the crucible 1 to maintain the silicon in the liquid state.

In operation, when the tape 4 is moved in the direction of the arrow 6, a layer 7 of polycrystalline silicon is deposited on both sides of the tape as it exits the bath.

Figure 2:
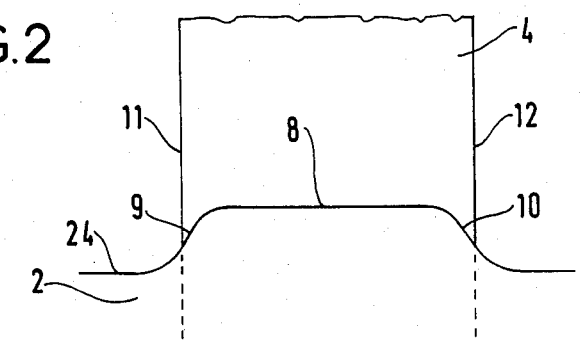
FIG. 2 is a schematic diagram showing the shape of the silicon crystallization isothermal relative to the level of the bath, in a device of the type shown in FIG. 1.

FIG. 2 shows the shape of the crystallization isothermal on the tape 4, that is to say the line joining the meniscus of the liquid silicon with the deposited silicon layer. It is seen that in the median part of the layer this line is virtually a horizontal straight line 8 situated above the level 24 of the bath. On the other hand, in the two lateral parts of the layer this line dips rapidly towards the level of the bath to form two downwardly concave curved sections 9 and 10.

As a result of this the thickness of the deposited silicon decreases rapidly towards the edges 11 and 12 of the tape. This decrease is visible in FIG. 3, in the two lateral strips 13 and 14 of the two layers of silicon deposited on the tape 4. On cooling, thermo-elastic stresses due to the difference between the coefficients of thermal expansion of the silicon and the carbon of the tape develop in the silicon layers. These stresses are inversely proportional to the thickness of the silicon. They result in the formation of microfractures in the edge strips which may propagate during the cutting operations which usually follow the deposition of the layers.

Moreover, the curvature of the connecting line in the lateral strips destroys the alignment of the grains of the deposited silicon, resulting in a deterioration in the electrical properties of the layers.

Figure 3:
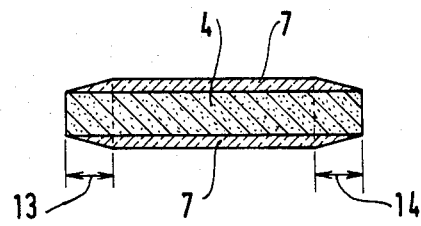
FIG. 3 is a view in transverse cross-section of a carbon tape coated with silicon, the coating being applied by a known process utilizing the device shown in FIG. 1.
Figure 4:
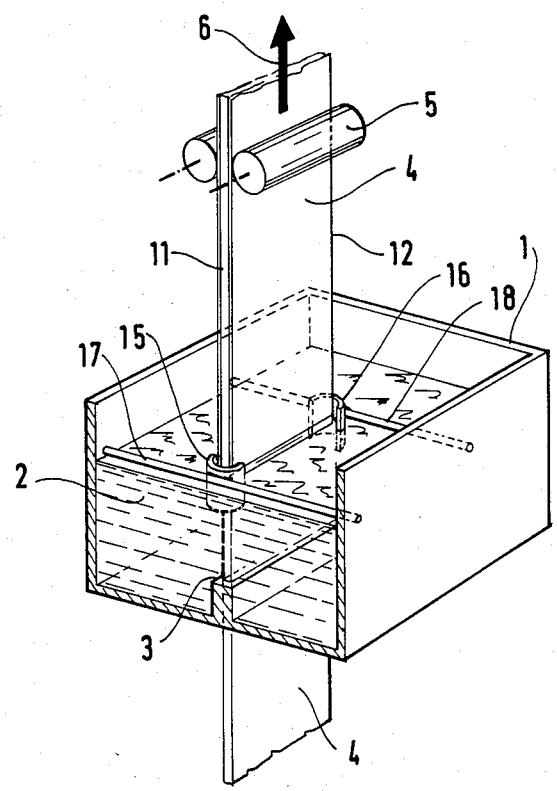
FIG. 4 is a perspective view of one embodiment of the device in accordance with the invention, in partial cross-section on a vertical plane.
Figure 5:
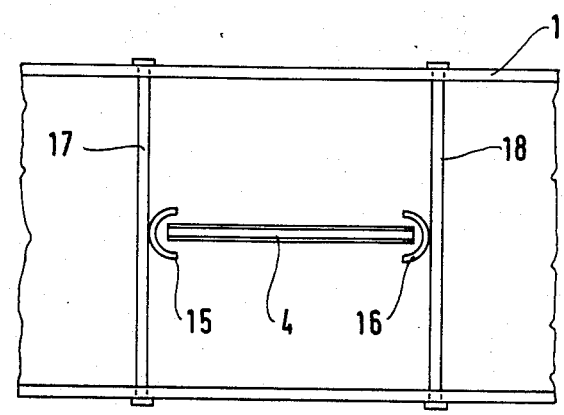
FIG. 5 is a plan view from above the device shown in FIG. 4.
Figure 6:
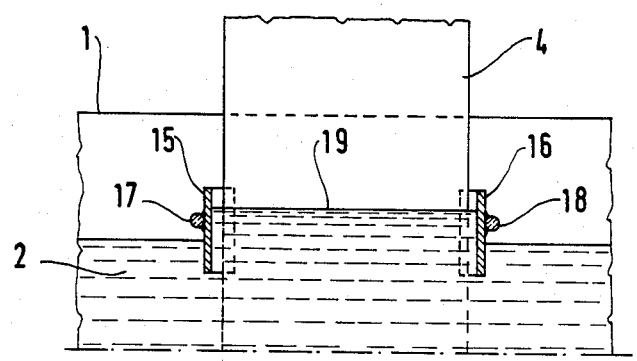
FIG. 6 is a view in vertical cross-section of the device shown in FIG. 4.

The device shown in FIGS. 4, 5, and 6 comprises the same component parts as the device shown in FIGS. 1 to 3, these components being designated by the same reference numerals. In accordance with one characteristic of the present invention this device further comprises two channels 15 and 16 of semicircular cross-section. These channels may be formed, for example, by respective half-tubes obtained by sectioning a circular tube on an axial plane. These channels, which may be of quartz, are welded on their convex sides to respective quartz rods 17 and 18 the ends of which are in turn attached to the edges of the vertical walls of the crucible 1. These rods maintain the channels 15 and 16 vertically on respective sides of the two lateral edges 11 and 12 of the tape 4, the concave side of these channels being turned towards these edges. The channels 15 and 16 are partially immersed in the bath 12, so as to raise its level by capillary action in the vicinity of the lateral edges of the tape. In the device shown in FIGS. 4 to 6, the channels 15 and 16 are disposed relative to the edges of the tape so as to obtain a crystallization isothermal 19 (see FIG. 6) which is rectlinear across the full width of the tape 4.

It is possible to control the degree to which the liquid silicon rises up the channels by capillary action by varying the following parameters:

channel inside diameter, distance and orientation of channels relative to the edges of the tape.

Figure 7:
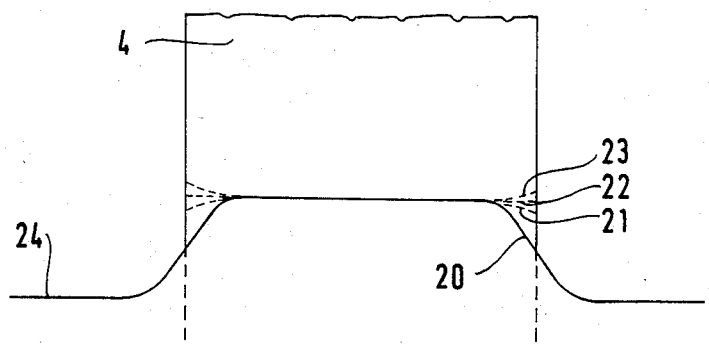
FIG. 7 is a schematic diagram showing various shapes of the crystallization isothermal which can be obtained using the device in accordance with the invention.

FIG. 7 shows that it is thus possible, by adjusting these parameters, to raise the crystallization isotherm at the edges of the tape relative to the curve 20 obtained in the prior art, by virtue of curves such as 21, 22 and 23. The curve 21 is still concave towards the level 24 of the bath, whereas the curve 22 is straight and the curve 23 is slightly concave upwards.

The device is accordance with the present invention may be used to deposit silicon on a carbon tape, these deposits not featuring the fractures which occur in the prior art. Moreover the usable surface area of the deposits is significantly increased. Finally, the electrical properties of the deposited silicon layers are enhanced.

The device in accordance with the present invention may be applied to the manufacture of solar cells.

It will be understood that various changes in the details, materials and arrangements of parts which have been herein described and illustrated in order to explain the nature of the invention may be made by those skilled in the art within the principle and scope of the invention as expressed in the appended claims.

I claim:

1. Device for depositing a layer of polycrystalline silicon on a carbon tape, comprising:

a crucible adapted to contain a bath of molten silicon, means for moving vertically upwards a carbon tape at least partially immersed in said bath and passing lengthwise and vertically through an equilibrium surface of said bath, whereby said layer is deposited on said tape, two vertical channels of semicircular cross-section adapted to be partially immersed in said bath with each one surrounding a respective lateral edge of said tape, whereby the surface of said bath is raised by capillary action in the vicinity of said lateral edges of said tape, and supports to which said channels are attached and which are supported by a wall of said crucible.

* * * * *